(12) United States Patent
Lin

(10) Patent No.: US 6,531,753 B1
(45) Date of Patent: Mar. 11, 2003

(54) EMBEDDED CONDUCTOR FOR SOI DEVICES USING A BURIED CONDUCTIVE LAYER/CONDUCTIVE PLUG COMBINATION

(75) Inventor: Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/174,046

(22) Filed: Jun. 18, 2002

Related U.S. Application Data
(60) Provisional application No. 60/299,041, filed on Jun. 18, 2001.

(51) Int. Cl.[7] ............... H01L 29/12; H01L 27/12
(52) U.S. Cl. ........................ 257/508; 257/347
(58) Field of Search .................. 257/347, 508

(56) References Cited

U.S. PATENT DOCUMENTS 5,442,223 A * 8/1995 Fujii ..................... 257/508
5,939,755 A * 8/1999 Takeuchi et al. ............. 257/347
6,429,486 B1 * 8/2002 Abe et al. ................ 257/508

* cited by examiner

*Primary Examiner*—Gene M. Munson
(74) *Attorney, Agent, or Firm*—Renner, Otto, Boisselle & Sklar, LLP

(57) ABSTRACT

A silicon-on-insulator substrate is disclosed which comprises: a silicon substrate layer; a first insulation layer over the silicon substrate layer; a conductive layer over the first insulation layer comprising at least one metal or metal silicide over the first insulation layer; a second insulation layer over the conductive layer; a silicon device layer comprising silicon over the second insulation layer; at least first conductive plug through the silicon substrate and the first insulation layer contacting the conductive layer; and at least one second conductive plug through the silicon device layer and the second insulation layer contacting the conductive layer. Also disclosed are methods for forming silicon-on-insulator substrates having improved stable ground characteristics.

9 Claims, 5 Drawing Sheets

EMBEDDED CONDUCTOR FOR SOI DEVICES USING A BURIED CONDUCTIVE LAYER/CONDUCTIVE PLUG COMBINATION

RELATED APPLICATION DATA

This application claims priority to previously filed U.S. Provisional Application No. 60/299,041, filed on Jun. 18, 2001, entitled "Embedded Conductor for SOI Devices Using a Buried Conductive Layer/Conductive Plug Combination", which is hereby incorporated herein by reference in its entirety.

FIELD OF THE INVENTION

The present invention generally relates to improved Silicon-on-Insulator (SOI) devices. More particularly, the present invention relates to methods for improving the grounding of Silicon-on-Insulator devices and devices having improved grounding characteristics.

BACKGROUND OF THE INVENTION

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are formed, for example, by implantations into the silicon layer while transistor gates are formed by forming a patterned oxide and conductor layer structure.

Such structures provide a significant gain in performance compared to bulk silicon structures by having lower parasitic capacitance (due to the insulator layer) and increased drain current due to floating body charging effects. This is because no connection is made to the channel region and charging of the floating body provides access towards a majority of carriers which dynamically lower the threshold voltage, resulting in increased drain current. Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latch-up; lower voltage applications; and higher "soft error" upset immunity (i.e., the immunity to the effects of alpha particle strikes).

Although there are significant advantages associated with SOI technology, there are significant disadvantages as well. For example, an unstable ground plane with respect to the various devices formed in and/or on the SOI substrate can lead to device shorting, reduced life expectancy, poor performance characteristics, etc. Thus, a ground potential which varies can lead to poor or even defective SOI devices.

In view of the aforementioned disadvantages, there is a need for SOI devices of improved quality, particularly SOI devices having improved ground planes, and more efficient methods of making such SOI devices.

SUMMARY OF THE INVENTION

As a result of the present invention, an SOI substrate having improved ground plane characteristics relative to the device layer is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

According to an aspect of the invention, a silicon-on-insulator substrate is disclosed which comprises: a silicon substrate layer; a first insulation layer over the silicon substrate layer; a conductive layer over the first insulation layer comprising at least one metal or metal silicide over the first insulation layer; a second insulation layer over the conductive layer; a silicon device layer comprising silicon over the second insulation layer; at least first conductive plug through the silicon substrate and the first insulation layer contacting the conductive layer; and at least one second conductive plug through the silicon device layer and the second insulation layer contacting the conductive layer.

According to another aspect of the invention, a method of forming a silicon-on-insulator substrate is disclosed which comprises the steps of: providing a silicon substrate; depositing a first insulation layer over the silicon substrate; forming a conductive layer over the first insulation layer to a first structure; providing a second structure comprising a silicon device layer and a second insulation layer; bonding the first structure and the second structure together so that the conductive layer is located between the first and second insulation layers; and removing a portion of the silicon device layer thereby providing the silicon-on-insulator substrate having two discrete insulation layers; forming at least one first conductive plug through the silicon substrate and the first insulation layer contacting the conductive layer; and forming at least one second conductive plug through the silicon device layer and the second insulation layer contacting the conductive layer.

According to another aspect of the invention, a method of facilitating a stable ground potential in a silicon-on-insulator substrate comprising bulk silicon, a first insulation layer over the bulk silicon, a second insulation layer over the conductive layer, and a silicon device layer over the second insulation layer is disclosed which comprises the steps of: forming a conductive layer between the first and second insulation layers; forming at least one first conductive plug through the bulk silicon and the first insulation layer so as to contact the conductive layer; and forming at least one second conductive plug through the silicon device layer and the second insulation layer so as to contact the conductive layer.

Due in part to the above methods, silicon-on-insulator substrates can be formed which have improved ground plane characteristics. Additionally, devices made in accordance with the present invention can yield devices which possess improved heat transfer capabilities. Furthermore, devices formed from such silicon-on-insulator substrates yield SOI devices of improved quality and reliability.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention

DETAILED DESCRIPTION

The present invention generally relates to improved Silicon-on-Insulator (SOI) devices. More particularly, the present invention relates to methods for providing an improved ground plane in Silicon-on-Insulator devices and devices having such characteristics. Such a ground plane can also function as a heat sink. As used throughout the specification and claims, the term conductive layer means a layer that is at least electrically conductive, and the term conductive plug means a plug that is at least electrically conductive. Such a layer and/or plug may, in some embodiments of the present invention, also be thermally conductive. It should also be noted that in the following text, range limits may be combined.

By forming an SOI substrate having improved ground characteristics, the performance of devices subsequently formed on the SOI substrate can be substantially improved. While not wishing to be bound to any theory, it is believed that by forming a conductive layer between two insulation layers (e.g., two buried oxide layers) according to the present invention, it is consequently possible to increase the stability of the ground potential of the buried conductive layer. Improving the stability of the ground potential in an SOI substrate consequently improves the performance and increases the life of devices, such as MOSFETs, formed on the device layer of the SOI substrate.

Figure 1:
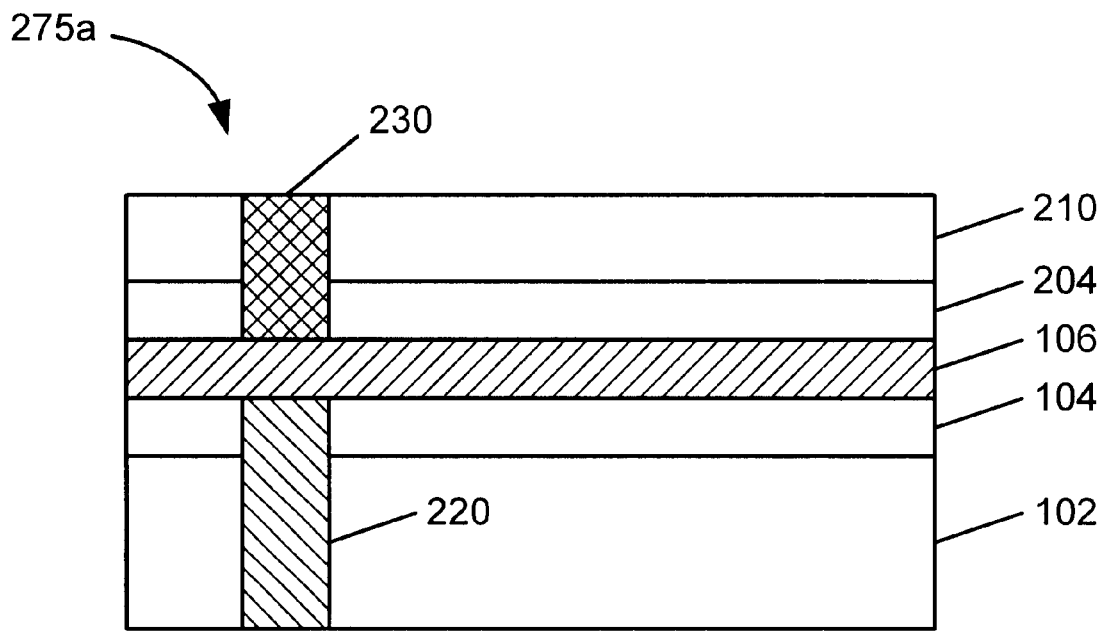
FIG. 1 is a cross-sectional view of a portion of an SOI substrate according to one embodiment of the present invention.

As is illustrated in FIG. 1, the present invention involves positioning a conductive layer 106 between two insulation layers 104 and 204 (e.g., two buried oxide layers) of an SOI substrate and forming at least one conductive plug 220 to provide a stable ground potential and conductive plug 230 to provide suitable ground contacts, if desired, for active devices formed on the device layer 210. In another embodiment, the conductive layer 106 and the conductive plugs 220 and 230 also function as heat spreaders or dissipaters.

In the embodiment where the conductive layer 106 also acts as a heat spreader, the conductive layer 106 has relatively high thermal conductivity and thus facilitates the transfer of heat away from and/or evenly spreads (preventing local build-up of) heat generated in the device layer of the SOI substrate. Contacts or conductive plugs (thermally conductive) can be employed to further draw any heat away from the conductive layer 106, either up through plugs in the device layer or down into the bulk silicon layer.

The conductive layer 106 contains an electrically conductive material (e.g., a metal) that forms a stable layer and adheres well to bulk silicon and/or an insulator material (such as silicon dioxide). In one embodiment, the conductive layer 106 is formed from at least one metal. Such metals include, but are not limited to, one or more of chromium, molybdenum, platinum, tantalum, titanium, and tungsten. The electrical conductivity of the conductive layer 106 is relatively high compared to the electrical conductivity of the at least insulation layer (104 and/or 204) and the bulk silicon. In one embodiment, the electrical conductivity of the conductive layer 106 is at least 100 times higher than the electrical conductivity of at least one of the insulation layers (104 and/or 204). In yet another embodiment, the electrical conductivity of the conductive layer 106 is at least 200 times higher than the electrical conductivity of at least one of the insulation layers (104 and/or 204).

In the instance where the conductive layer 106 also functions as a heat dispersing layer, the thermal conductivity of the conductive layer 106 is at least 100 times higher than the thermal conductivity of at least one of the insulation layers (104 and/or 204). In another embodiment, the conductive layer 106 has a thermal conductivity of at least about 150 W/m °C., or even at least about 200 W/m °C. In yet another embodiment, the thermal conductivity of the conductive layer 106 is at least 200 times higher than the thermal conductivity of at least one of the insulation layers (104 and/or 204).

The conductive layer 106 can be formed to any thickness suitable to yield the desired ground plane for one or more subsequently formed devices on the device layer 210. In one embodiment, generally, the thickness of the conductive layer 106 is from about 100 Å to about 4,000 Å. In another embodiment, the thickness of the conductive layer 106 is from about 200 Å to about 3,000 Å. In another embodiment the thickness of the conductive layer 106 is based on the thickness of at least one of the insulation layers (104 and/or 204) located on either side of the conductive layer 106. In one embodiment, the conductive layer 106 is less than 15% the thickness of at least one of the insulation layers (104 and/or 204) on either side of the conductive layer. In another embodiment, the conductive layer 106 is less than 15% the thickness of both of the insulation layers on either side of the conductive layer 106. In yet another embodiment, the conductive layer 106 is greater than 50% the thickness of at least one of the insulation layers (104 and/or 204) on either side of the conductive layer. In another embodiment, the conductive layer 106 is greater than 50% the thickness of both of the insulation layers (104 and/or 204) on either side of the conductive layer 106.

A first structure 100 (see FIG. 2) is produced by forming an insulation layer 104 and a conductive layer 106 thereon in any suitable manner over a bulk or monocrystalline silicon layer 102. Initially, the insulation layer 104 (e.g., an oxide layer) is formed over the bulk or monocrystalline silicon layer 102 using methods known in the art, such as chemical vapor deposition (CVD), plasma enhanced chemical vapor deposition (PECVD), spin on depositing, thermal oxidation, or a wet and dry oxidation process. In one embodiment, the insulation layer 104 can be formed from, but is not limited to, any one of silicon dioxide, a variation of silicon dioxide, silicon nitride, hydrogen silsesquioxane (HSQ), methyl silsesquioxane (MSQ), benzocyclobutene (BCB), fluorinated aromatic ether (FLARE), SILK®, NANOGLASS® and fluorinated glass (FSG).

Next the conductive layer 106 is formed over the insulation layer 104 from one or more of the materials previously discussed above. The conductive layer 106 is formed in any suitable manner over the insulation layer 104 including direct metal deposition. Direct metal deposition simply involves depositing a metal on the insulation layer 104. This can be accomplished by physical vapor deposition (PVD), and particularly sputtering or chemical vapor deposition (CVD). Such methods are known in the art. This structure containing the conductive layer 106 is then bonded to a second structure 200 (see FIG. 3) containing an insulation layer 204 on a bulk silicon layer 202 (typically the same type of structure as that of FIG. 2 but without conductive layer 106 formed over insulation layer 104). The two structures are fused so that conductive layer 106 on the first structure is bonded to insulation layer 204 of the second structure to yield a conductive layer 106 sandwiched between two insulation layers 104 and 204 (see FIG. 4), and the bulk silicon layer 202 of the second structure 200 is etched back to a desired thickness to form an SOI substrate 250a having a silicon device layer 210 (see FIG. 5).

In another embodiment, the conductive layer 106 of the first structure 100 can be formed from a metal silicide rather than a metal. The metal silicide layer may, for example, be formed by PVD or CVD techniques. After the metal silicide layer is formed over the above-mentioned insulation layer 104, this first structure 100 containing the silicide conductive layer 106 is then bonded to the second structure 200 containing the insulation layer 204 on the bulk silicon layer 202 (typically the same type of structure, but without the silicide conductive layer). The two structures 100 and 200 are fused together as noted above, and the bulk silicon layer 202 of the second structure 200 is etched back to a desired thickness to form the device layer 210 on an SOI substrate 250a.

The SOI substrate 250a formed in accordance with the present invention has a bulk or monocrystalline silicon layer 102, a first buried insulation layer 104 over the bulk silicon layer 102, a conductive layer 106 over the first buried insulation layer 104, a second buried insulation layer 204 over and on the other side of the conductive layer 106, and a silicon layer 210 (device layer) over the second buried insulation layer 204. The first and second buried insulation layers 104 and 204, respectively, typically contain silicon dioxide. Although, as noted above, the buried insulation layers 104 and 204 may contain any suitable insulating or oxide material. Each buried insulation layer has thickness from about 100 Å to about 5,000 Å. In another embodiment, each buried insulation layer has a thickness from about 1,000 Å to about 4,000 Å. In yet another embodiment, each buried insulation layer has thickness from about 2,000 Å to about 3,500 Å. The device layer has thickness from about 500 Å to about 5,000 Å. In another embodiment, the device layer has thickness from about 1,000 Å to about 3,000 Å, or even from about 1,000 Å to about 2,000 Å.

In one embodiment, the conductive layer has a thickness that is one of less than 15% of the thickness of at least one of the insulation layers and greater than 50% of the thickness of at least one of the insulation layers. In another embodiment, the conductive layer has a thickness that is one of less than 10% of the thickness of at least one of the insulation layers and greater than 60% of the thickness of at least one of the insulation layers.

One or more conductive plugs 220 (FIG. 6) and 230 (FIG. 7) are subsequently formed above and below the conductive layer 106. The at least one conductive plug 220 may be used to stabilize the ground potential of the SOI substrate, while the at least one conductive plug 230 may be used as a contact for any devices formed on device layer 210 of the SOI substrate.

In addition, the combination of the conductive layer 106 and the conductive plugs 220 and/or 230 can also facilitate the transfer of heat away from the device layer, and particularly away from the conductive layer. Heat removed via the conductive plugs is dissipated in the bulk silicon layer or in overlying layers or structures. In such an instance, the conductive plugs also have a thermal conductivity of at least about 150 W/m °C., or even at least about 200 W/m °C.

Figure 2:
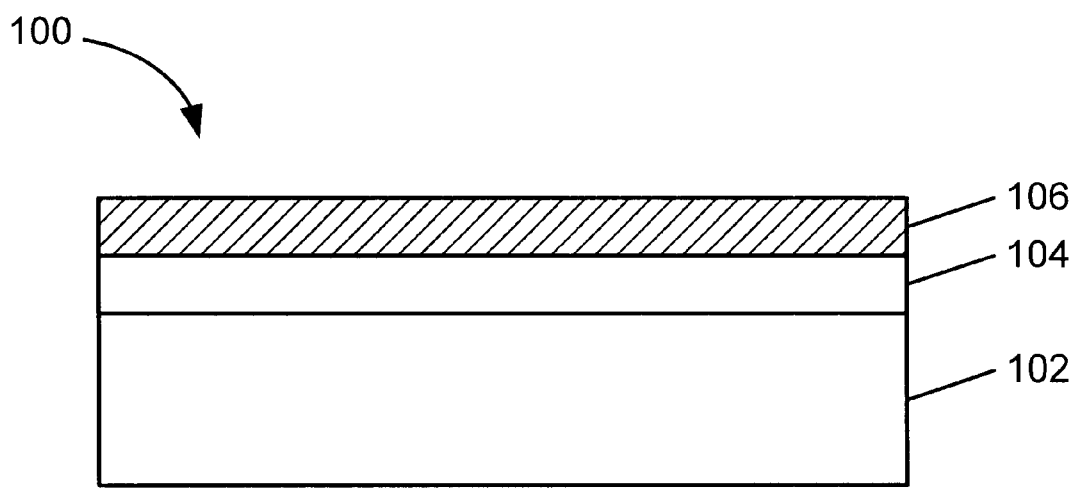
FIG. 2 is a cross-sectional view of a portion of a first structure used to make an SOI substrate according to one embodiment of the present invention.

Briefly summarizing the above-mentioned process, one embodiment of the present invention will be described with reference to FIGS. 2 to 7. Specifically as is illustrated in FIG. 2, the first structure 100 is formed which contains the bulk silicon layer 102, the first buried insulation layer 104 over the bulk silicon layer 102, and the conductive layer 106 over the first buried insulation layer 104 as is described below. Initially, the bulk silicon substrate or wafer 102 is provided and the insulation layer 104 containing silicon dioxide is then formed over the bulk silicon substrate or wafer 102 by CVD techniques. Either low pressure chemical vapor deposition (LPCVD) or plasma enhanced chemical vapor deposition (PECVD) may be employed. In this embodiment, the insulation layer 104 is formed by PECVD using either silane and oxygen or silane and nitrous oxide. Also in this embodiment, the insulation layer 104 has a thickness of about 1,500 Å. Next, the conductive layer 106 is formed over the insulation layer 104 from a suitable metal or metal silicide. In this embodiment, platinum is sputtered over the insulation layer 104 to a thickness of about 400 Å. Alternatively, one or more of chromium, molybdenum, tantalum, titanium, and tungsten can be used in place of or in addition to platinum.

Figure 3:
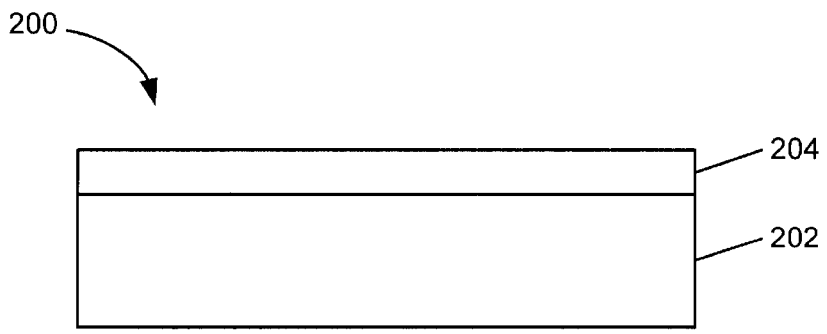
FIG. 3 is cross-sectional view of a portion of a second structure used to make an SOI substrate according to one embodiment of the present invention.

Referring to FIG. 3, the second structure 200 is provided. The second structure 200 contains a bulk silicon layer 202 and an insulation layer 204 there over. In this embodiment, the insulation layer 204 contains silicon dioxide. Also in this embodiment, the thickness of the insulation layer 204 is about 1,500 Å.

Figure 4:
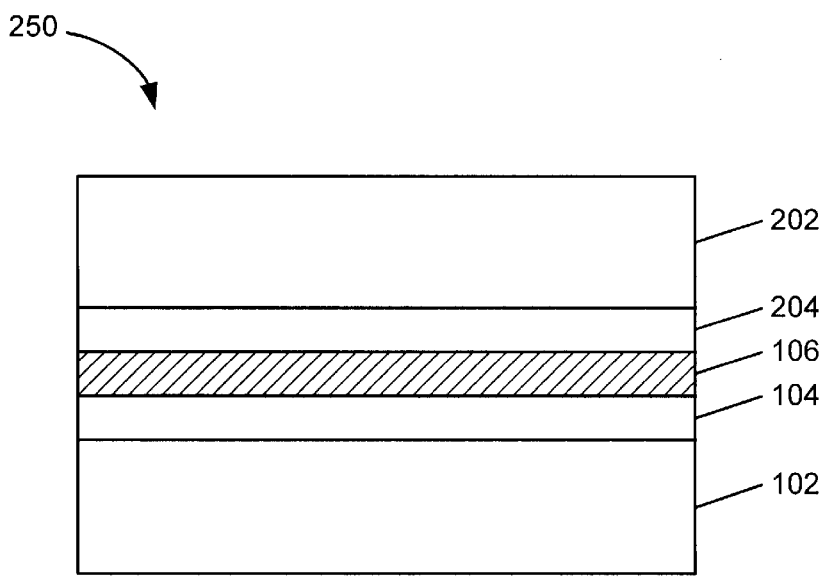
FIG. 4 is cross-sectional view of a portion of a bonded structure used to make an SOI substrate according to one embodiment of the present invention.

Referring to FIG. 4, the first structure 100 is bonded to the second structure 200 via the first structure's conductive layer 106 and the second structure's insulation layer 204 to yield combined structure 250. The conductive layer 106 and the insulation layer 204 are fused by application of heat for a sufficient period of time to bond the first and second structures 100 and 200. For example, the first and second structures 100 and 200 are held together for about 2 hours under a temperature of about 1,100° C.

Figure 5:
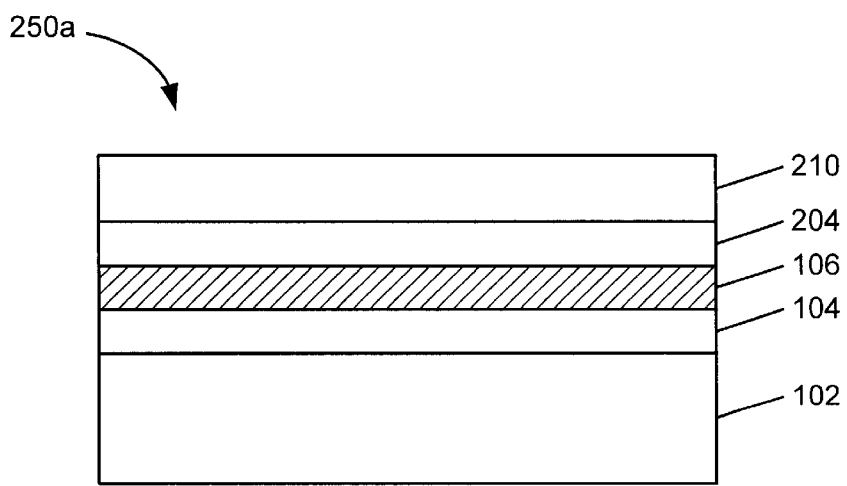
FIG. 5 is cross-sectional view of a portion of the bonded structure of FIG. 4 after formation of the device layer used to make an SOI substrate according to one embodiment of the present invention.

Referring to FIG. 5, the bulk silicon layer 202 of FIG. 4 of the second structure 200 is etched to a desired thickness to provide SOI substrate 250a and specifically the device layer 210. The SOI substrate 250a contains the bulk silicon layer 102, the first buried insulation layer 104, the conductive layer 106, the second buried insulation layer 204, and the device layer 210. The thickness of the device layer 210 is about 1,500 Å. The thickness of each of the first and second buried insulation layers 104 and 204 (formerly insulation layers 104 and 204) is about 1,500 Å. The thickness of the conductive layer 106 remains about the same as initially deposited. In this embodiment, the conductive layer 106 has a thickness that is about 13% of the combined thickness of both the first and second buried insulation layers 104 and 204.

In one embodiment, the SOI substrate 250a also has good heat removal properties due to the presence of the conductive layer 106. In particular, the high thermal conductivity of platinum or even platinum silicide (relative to silicon dioxide) removes heat that may locally accumulate in certain areas (typically near or under devices and/or conductive structures) of the device layer and the buried insulation layers. The high thermal conductivity of platinum also dissipates heat that may locally accumulate in certain areas of the device layer and the buried insulation layers (or distributes the heat throughout the platinum suicide layer).

Figure 6:
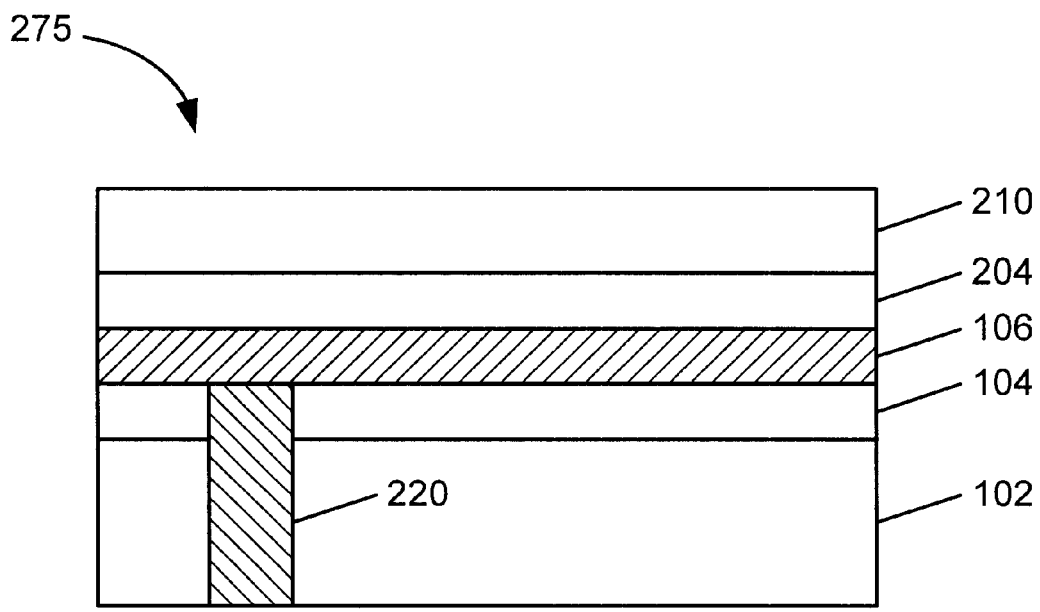
FIG. 6 is cross-sectional view of a portion of an SOI substrate in which a conductive plug has been formed in the bulk silicon portion of the SOI substrate according to one embodiment of the present invention.

Referring to FIG. 6, at least one conductive plug 220 is formed in the bulk silicon substrate 102 and the first buried insulation layer 104 of SOI substrate 250a to yield a structure 275 having a stable ground potential. In one embodiment, conductive plug 220 contains an optional barrier layer and a conductive material. Use of an optional barrier layer (not shown) depends upon the identity of the conductive material of the conductive plug 220. The barrier layer, if employed, serves as a diffusion barrier layer preventing the conductive material of the conductive plug 220 from diffusing into the bulk silicon substrate 102. The barrier layer may be made of any suitable conductive material or materials. Examples of suitable conductive materials for the barrier layer include titanium nitride, tungsten, tantalum, tungsten-titanium alloys such as an alloy containing about 90% tungsten and about 10% titanium, tantalum silicon nitride, tungsten nitride, niobium, molybdenum and combinations thereof. The barrier layer may be formed using any suitable technique to a thickness sufficient to serve as a diffusion barrier for conductive plug 220. For example, the thickness of the barrier layer may be in the range from about 100 Å to about 1,500 Å.

Conductive plug 220 is then formed in the substrate 102 and the overlying first buried insulation layer 104 (by initially etching a contact hole using suitable lithography and etching techniques) to yield structure 275. The conductive plug 220 may be made of any suitable conductive material or materials. Examples of suitable conductive materials include one or more of copper, tungsten, gold, silver, aluminum, and any alloys thereof. In one embodiment, the conductive material is tungsten. The barrier layer and the conductive plug 220 may be deposited using CVD or PVD techniques. The conductive plug 220 allows conductive layer 106 to act as a stable ground plane and can additionally remove heat from the conductive layer 106 and transfer it down through the structure to other layers or structures (not shown).

Figure 7:
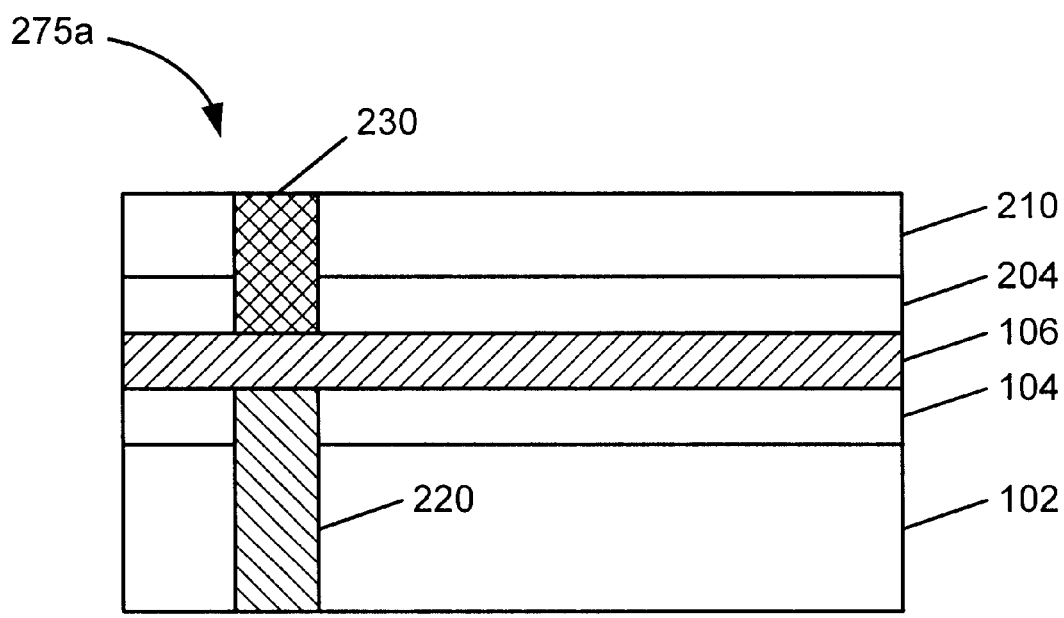
FIG. 7 is cross-sectional view of a portion of the SOI substrate in which a conductive plug has been formed in device layer portion of the SOI substrate of FIG. 6.

Referring to FIG. 7, at least one conductive plug 230 is formed in the silicon device layer 210 and the second buried insulation layer 204 of SOI substrate 275 to yield a structure 275a having a stable ground potential and at least one electrical contact for one or more devices formed thereon. In one embodiment, conductive plug 230 contains an optional barrier layer and a conductive material. Use of an optional barrier layer (not shown) depends upon the identity of the conductive material of the conductive plug 230. The barrier layer, if employed, serves as a diffusion barrier layer preventing the conductive material of the conductive plug 230 from diffusing into the silicon device layer 210. The barrier layer may be made of any suitable conductive material or materials. Examples of suitable conductive materials for the barrier layer include titanium nitride, tungsten, tantalum, tungsten-titanium alloys such as an alloy containing about 90% tungsten and about 10% titanium, tantalum silicon nitride, tungsten nitride, niobium, molybdenum and combinations thereof. The barrier layer may be formed using any suitable technique to a thickness sufficient to serve as a diffusion barrier for conductive plug 230. For example, the thickness of the barrier layer may be in the range from about 100 Å to about 1,500 Å.

Conductive plug 230 is then formed in the device layer 210 and the underlying second buried insulation layer 204 (by initially etching a contact hole using suitable lithography and etching techniques) to yield structure 275a. The conductive plug 230 may be made of any suitable conductive material or materials. Examples of suitable conductive materials include one or more of copper, tungsten, gold, silver, aluminum, and any alloys thereof. In one embodiment, the conductive material is tungsten. The material utilized to form conductive plug 230 may be the same or different from that used to form conductive plug 220. Additionally, the conductive plugs 220 and 230 do not need to be the same size and/or aligned in order for the present invention to function. Rather, any suitable alignment and/or design can be used as long as a stable ground potential is maintained.

The barrier layer and the conductive plug 230 may be deposited using CVD or PVD techniques. The conductive plug 230 provides access to a stable ground potential for devices formed in and/or on device layer 210. Additionally, conductive plug 230 can act as a heat sink for any device which is formed in contact therewith by transferring heat down through the structure 275a to other layers or structures (not shown).

Referring to FIGS. 2 to 5, 8 and 9, another specific example of the present invention is described. Specifically referring to FIG. 2, the first structure 100 is formed which contains the bulk silicon layer 102, the first buried insulation layer 104 over the bulk silicon layer 102, and the conductive layer 106 over the first buried insulation layer 104 as is described below. Initially, the bulk silicon substrate or wafer 102 is provided and the insulation layer 104 containing silicon dioxide is then formed over the bulk silicon substrate or wafer 102 by CVD techniques. Either low pressure chemical vapor deposition (LPCVD) or plasma enhanced chemical vapor deposition (PECVD) may be employed. In this embodiment, the insulation layer 104 is formed by PECVD using either silane and oxygen or silane and nitrous oxide. Also in this embodiment, the insulation layer 104 has a thickness of about 1,000 Å. Next, the conductive layer 106 formed from a suitable metal or metal silicide which is deposited over the insulation layer 104. In this embodiment, titanium is sputtered over the insulation layer 104 to a thickness of about 1,100 Å. Alternatively, one or more of chromium, molybdenum, tantalum, platinum, and tungsten can be used in place of or in addition to titanium.

Referring to FIG. 3, the second structure 200 is provided. The second structure 200 contains the bulk silicon layer 202 and the insulation layer 204 there over. In this embodiment, the insulation layer 204 contains silicon dioxide. Also in this embodiment, the thickness of the insulation layer 204 is about 1,000 Å.

Referring to FIG. 4, the first structure 100 is bonded to the second structure 200 via the first structure's conductive layer 106 and the second structure's insulation layer 204 to yield a combined structure 250. The conductive layer 106 and the insulation layer 204 are fused by application of heat for a sufficient period of time to bond the first and second structures 100 and 200. For example, the first and second structures 100 and 200 are held together for about 3 hours under a temperature of about 1,050° C.

Referring to FIG. 5, the bulk silicon layer 202 of FIG. 4 of the second structure 200 is etched to a desired thickness to provide SOI substrate 250a and specifically the device layer 210. The SOI substrate 250a contains the bulk silicon layer 102, the first buried insulation layer 104, the conductive layer 106, the second buried insulation layer 204, and the device layer 210. The thickness of the device layer 210 is about 2,000 Å. The thickness of each of the first and second buried insulation layers 104 and 204 (formerly insulation layers 104 and 204) is about 1,000 Å. The thickness of the conductive layer 106 remains about the same as initially deposited. In this embodiment, the conductive layer 106 has a thickness that is about 55% of the combined thickness of both the first and second buried insulation layers 104 and 204.

In one embodiment, the SOI substrate 250a also has good heat removal properties due to the presence of the conductive layer 106. In particular, the high thermal conductivity of titanium or even titanium silicide (relative to silicon dioxide) removes heat that may locally accumulate in certain areas (typically near or under devices and/or conductive structures) of the device layer and the buried insulation layers. The high thermal conductivity of titanium also dissipates heat that may locally accumulate in certain areas of the device layer and the buried insulation layers (or distributes the heat throughout the titanium silicide layer).

Figure 8:
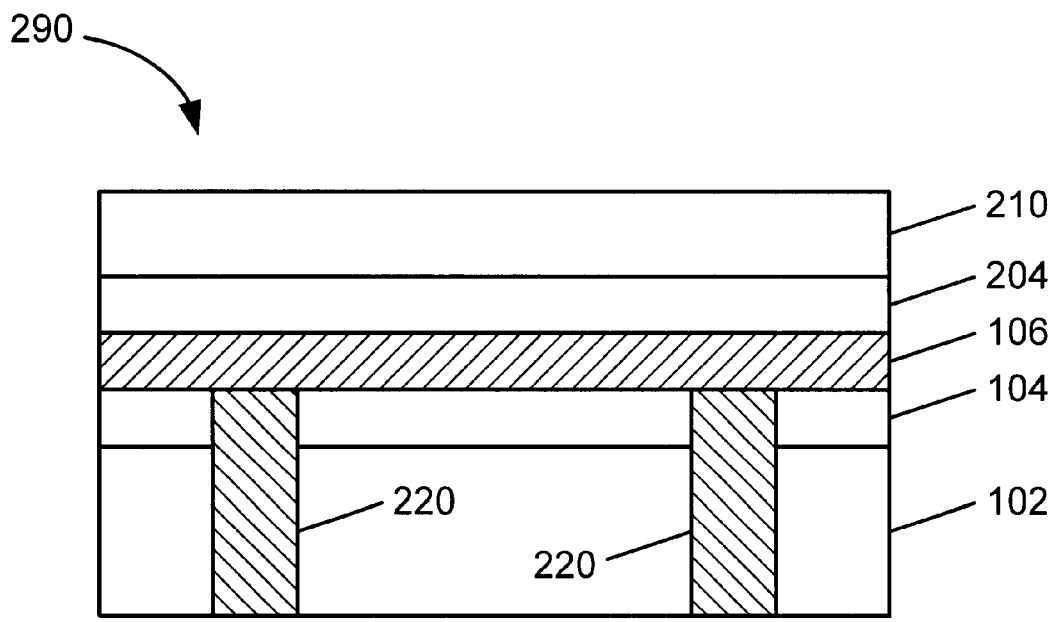
FIG. 8 is cross-sectional view of a portion of an SOI substrate in which two conductive plugs have been formed in the bulk silicon portion of the SOI substrate according to one embodiment of the present invention.

Referring to FIG. 8, at least two conductive plugs 220 are formed in the bulk silicon substrate 102 and the first buried insulation layer 104 of SOI substrate 250a to yield a structure 290 having a stable ground potential. In one embodiment, conductive plugs 220 contain an optional barrier layer and a conductive material. Use of an optional barrier layer (not shown) depends upon the identity of the conductive material of conductive plugs 220. The barrier layer, if employed, serves as a diffusion barrier layer preventing the conductive material of conductive plugs 220 from diffusing into the bulk silicon substrate 102. The barrier layer may be made of any suitable conductive material or materials. Examples of suitable conductive materials for the barrier layer include titanium nitride, tungsten, tantalum, tungsten-titanium alloys such as an alloy containing about 90% tungsten and about 10% titanium, tantalum silicon nitride, tungsten nitride, niobium, molybdenum and combinations thereof. The barrier layer may be formed using any suitable technique to a thickness sufficient to serve as a diffusion barrier for conductive plugs 220. For example, the thickness of the barrier layer may be in the range from about 100 Å to about 1,500 Å.

Conductive plugs 220 are then formed in the substrate 102 and the overlying first buried insulation layer 104 (by initially etching a contact hole using suitable lithography and etching techniques) to yield structure 290. The conductive plugs 220 may be made of any suitable conductive material or materials. Examples of suitable conductive materials include one or more of copper, tungsten, gold, silver, aluminum, and any alloys thereof. In one embodiment, the conductive material is tungsten. The barrier layer and conductive plugs 220 may be deposited using CVD or PVD techniques. The conductive plugs 230 allow conductive layer 106 to act as a stable ground plane and can additionally remove heat from the conductive layer 106 and transfer it down through the structure to other layers or structures (not shown).

Figure 9:
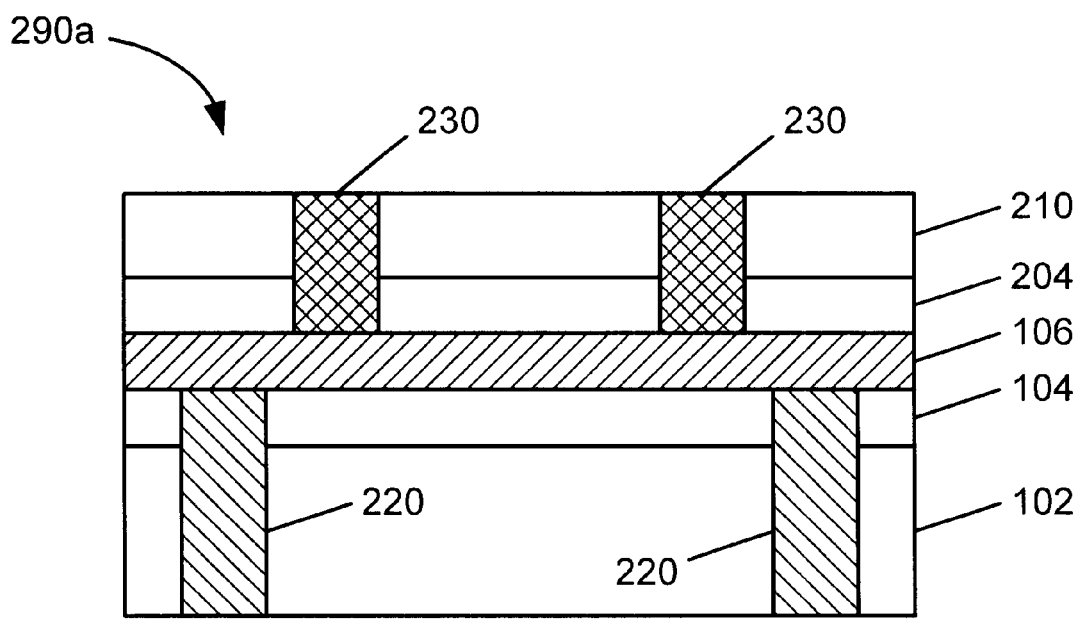
FIG. 9 is cross-sectional view of a portion of the SOI substrate in which two conductive plugs have been formed in device layer portion of the SOI substrate of FIG. 8.
Figure 10:
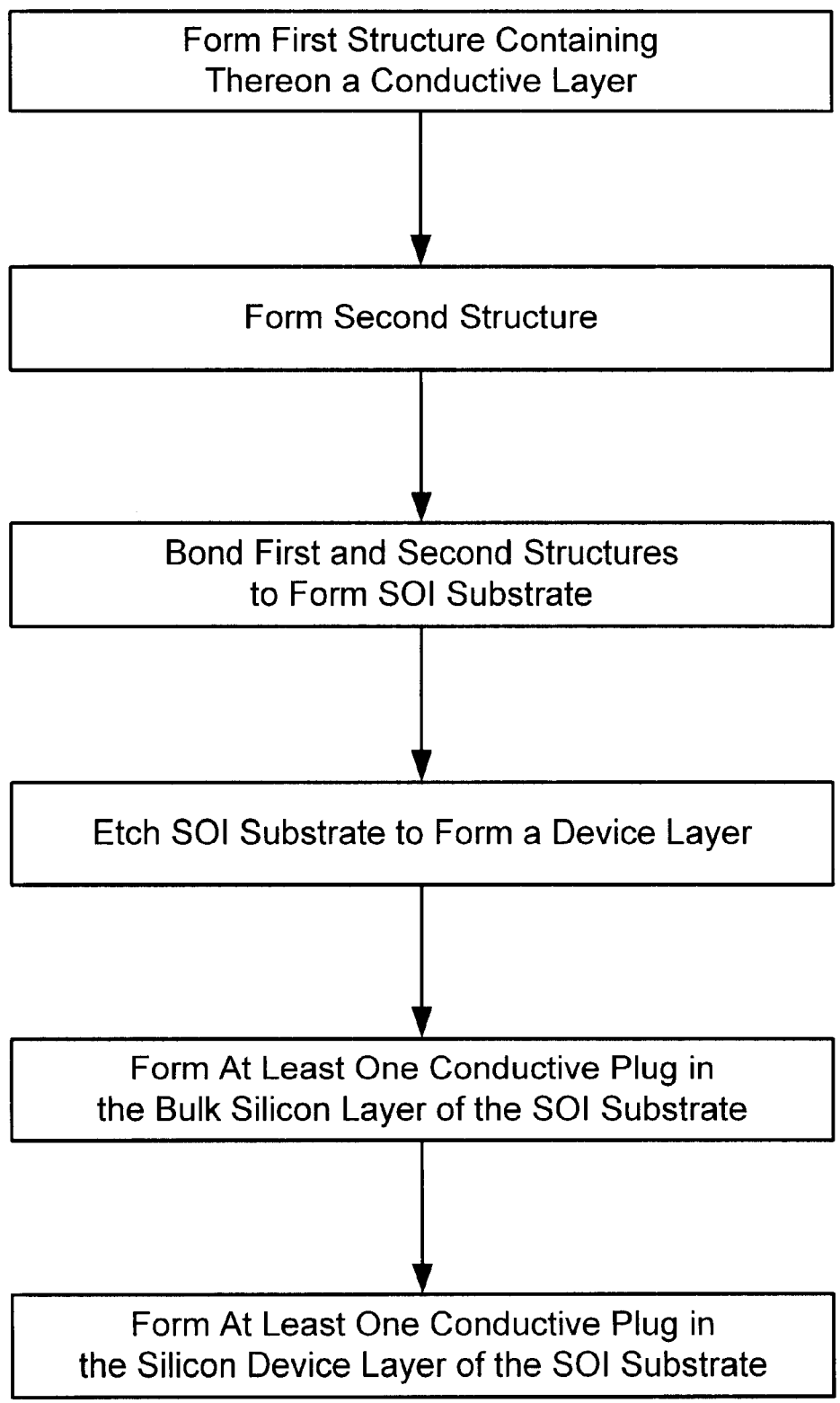
FIG. 10 is a flow chart showing the process steps used to produce a SOI substrate according to one embodiment of the present invention.

Referring to FIG. 9, at least two conductive plugs 230 are formed in the silicon device layer 210 and the second buried insulation layer 204 of SOI substrate 290 to yield a structure 290a having a stable ground potential and at least two electrical contacts for one or more devices formed thereon. In one embodiment, conductive plugs 230 contain an optional barrier layer and a conductive material. Use of an optional barrier layer (not shown) depends upon the identity of the conductive material of conductive plugs 230. The barrier layer, if employed, serves as a diffusion barrier layer preventing the conductive material of conductive plugs 230 from diffusing into the silicon device layer 210. The barrier layer may be made of any suitable conductive material or materials. Examples of suitable conductive materials for the barrier layer include titanium nitride, tungsten, tantalum, tungsten-titanium alloys such as an alloy containing about 90% tungsten and about 10% titanium, tantalum silicon nitride, tungsten nitride, niobium, molybdenum and combinations thereof. The barrier layer may be formed using any suitable technique to a thickness sufficient to serve as a diffusion barrier for conductive plugs 230. For example, the thickness of the barrier layer may be in the range from about 100 Å to about 1,500 Å.

Conductive plugs 230 are then formed in the device layer 210 and the underlying second buried insulation layer 204 (by initially etching a contact hole using suitable lithography and etching techniques) to yield structure 290a. The conductive plugs 230 may be made of any suitable conductive material or materials. Examples of suitable conductive materials include one or more of copper, tungsten, gold, silver, aluminum, and any alloys thereof. In one embodiment, the conductive material is tungsten. The material utilized to form conductive plugs 230 may be the same or different from that used to form conductive plugs 220. Additionally, the conductive plugs 220 and 230 do not need to be the same size and/or aligned in order for the present invention to function. Rather, any suitable alignment and/or design can be used as long as a stable ground potential is maintained.

The barrier layer and conductive plugs 230 may be deposited using CVD or PVD techniques. The conductive plugs 230 provide access to a stable ground potential for devices formed on device layer 210. Additionally, conductive plugs 230 can act as a heat sink for any device which is formed in contact therewith by transferring heat down through the structure 290a to other layers or structures (not shown).

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A silicon-on-insulator substrate, comprising:
   a silicon substrate layer;
   a first insulation layer over the silicon substrate layer;
   a conductive layer over the first insulation layer comprising at least one metal or metal silicide over the first insulation layer;
   a second insulation layer over the conductive layer;
   a silicon device layer comprising silicon over the second insulation layer;
   at least first conductive plug through the silicon substrate and the first insulation layer contacting the conductive layer; and
   at least one second conductive plug through the silicon device layer and the second insulation layer contacting the conductive layer.

2. The silicon-on-insulator substrate of claim 1, wherein the conductive layer comprises at least one of chromium, molybdenum, platinum, tantalum, titanium, and tungsten.

3. The silicon-on-insulator substrate of claim 2, wherein the conductive layer comprises at least one of titanium, platinum and tungsten.

4. The silicon-on-insulator substrate of claim 1, wherein the conductive layer comprises at least one of chromium silicide, molybdenum silicide, platinum silicide, tantalum silicide, titanium silicide, and tungsten silicide.

5. The silicon-on-insulator substrate of claim 1, wherein the conductive layer has a thickness from about 150 Å to about 500 Å.

6. The silicon-on-insulator substrate of claim 1, wherein the conductive layer has a thickness from about 1,500 Å to about 3,500 Å.

7. The silicon-on-insulator substrate of claim 1, wherein the at least one first and the at least one second conductive plugs comprise at least one of copper, tungsten, gold, silver, and aluminum.

8. The silicon-on-insulator substrate of claim 7, wherein the at least one first conductive plug is formed from a different material than the at least one second conductive plug.

9. The silicon-on-insulator substrate of claim 1, wherein at least one of the first insulation layer and the second insulation layer comprise silicon dioxide.

* * * * *

UNITED STATES PATENT AND TRADEMARK OFFICE
CERTIFICATE OF CORRECTION

PATENT NO.    : 6,531,753 B1
DATED         : March 11, 2003
INVENTOR(S)   : Ming-Ren Lin It is certified that error appears in the above-identified patent and that said Letters Patent is hereby corrected as shown below:

<u>Column 7,</u>
Line 30, replace "SUICIDE" with -- SILICIDE --

Signed and Sealed this

Sixth Day of May, 2003

JAMES E. ROGAN
*Director of the United States Patent and Trademark Office*